United States Patent [19]
Yonezawa et al.

[11] Patent Number: 5,999,268
[45] Date of Patent: Dec. 7, 1999

[54] APPARATUS FOR ALIGNING A SEMICONDUCTOR WAFER WITH AN INSPECTION CONTACTOR

[75] Inventors: Toshihiro Yonezawa; Kunio Sano, both of Yamanashi-ken; Takashi Sato, Nirasaki, all of Japan

[73] Assignee: Tokyo Electron Limited, Tokyo, Japan

[21] Appl. No.: 08/950,832

[22] Filed: Oct. 15, 1997

[30] Foreign Application Priority Data

Oct. 18, 1996 [JP] Japan ................................. 8-297463

[51] Int. Cl.⁶ ............................. G01B 11/00; G01R 31/02
[52] U.S. Cl. ........................................... 356/399; 324/754
[58] Field of Search .................................. 356/399–401; 324/73.1, 754, 690, 458, 537; 414/404, 416, 417, 331, 172, 156

[56] References Cited

U.S. PATENT DOCUMENTS

| | | | |
|---|---|---|---|
| 5,275,521 | 1/1994 | Wada ........................ | 414/406 |
| 5,412,329 | 5/1995 | Iino et al. ................. | 324/754 |
| 5,440,241 | 8/1995 | King et al. ................ | 324/765 |
| 5,539,324 | 7/1996 | Wood et al. ............... | 324/758 |
| 5,570,032 | 10/1996 | Atkins et al. .............. | 324/760 |
| 5,585,738 | 12/1996 | Kuji et al. ................ | 324/754 |
| 5,604,443 | 2/1997 | Kitamura et al. .......... | 324/754 |
| 5,640,101 | 6/1997 | Kuji et al. ................ | 324/754 |
| 5,644,245 | 7/1997 | Saitoh et al. ............. | 324/754 |

FOREIGN PATENT DOCUMENTS

| | | |
|---|---|---|
| 0 552 036 | 7/1993 | European Pat. Off. . |
| 0 675 366 | 10/1995 | European Pat. Off. . |
| 4302448 | 10/1992 | Japan . |
| 5-13524 | 1/1993 | Japan . |
| 7-147304 | 6/1995 | Japan . |
| 8-005666 | 1/1996 | Japan . |

*Primary Examiner*—Frank G. Font
*Assistant Examiner*—Michael P. Stafira
*Attorney, Agent, or Firm*—Oblon, Spivak, McClelland, Maier & Neustadt, P.C.

[57] ABSTRACT

An aligning apparatus includes a first image pickup camera for picking up an image of an inspection contactor, a moving body located so as to be movable in X-, Y-, Z- and θ-directions and having the first image pickup camera fixed thereon, a wafer bearer capable of being located on the moving body and supporting a semiconductor wafer, a control circuit for controlling movements of the moving body moved in the individual directions, and a second image pickup camera for picking up an image of the semiconductor wafer on the bearer moving under the control of the control circuit. Positions for the first and second image pickup cameras to pick up the images are stored, the first image pickup camera picks up an image of the contact, the position of the contact is stored, the second image pickup camera picks up an image of an electrode of a chip corresponding to the contact, the position of the electrode is stored, and then the contact and the electrode are aligned with each other in accordance with the respective positions of the contact and the electrode.

6 Claims, 6 Drawing Sheets

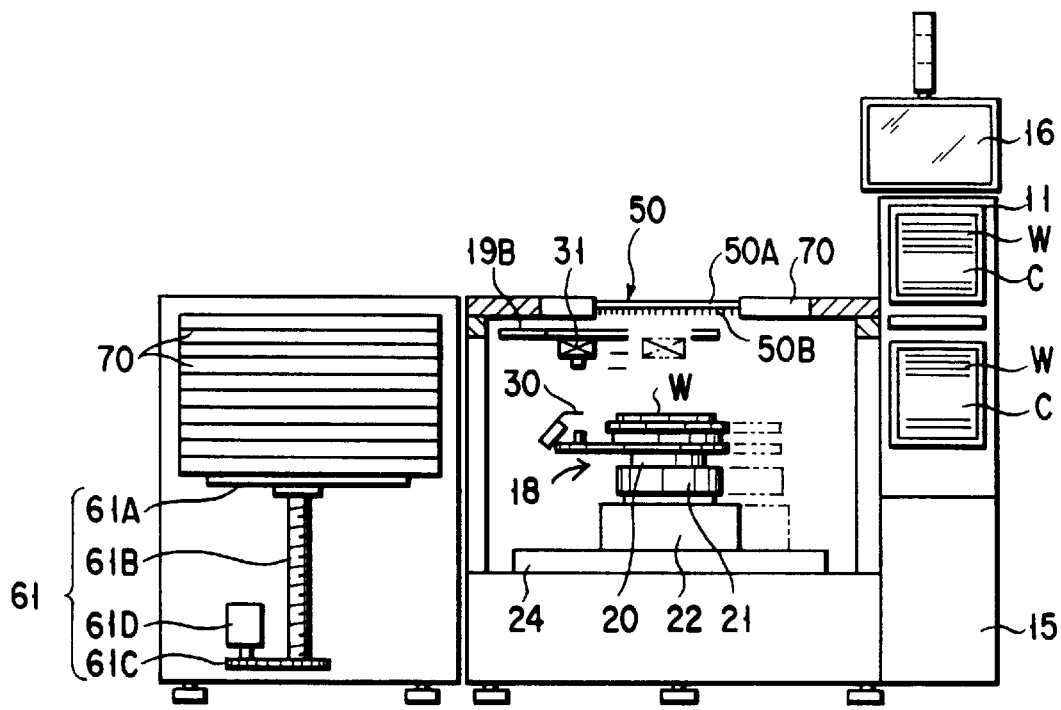
F I G. 2
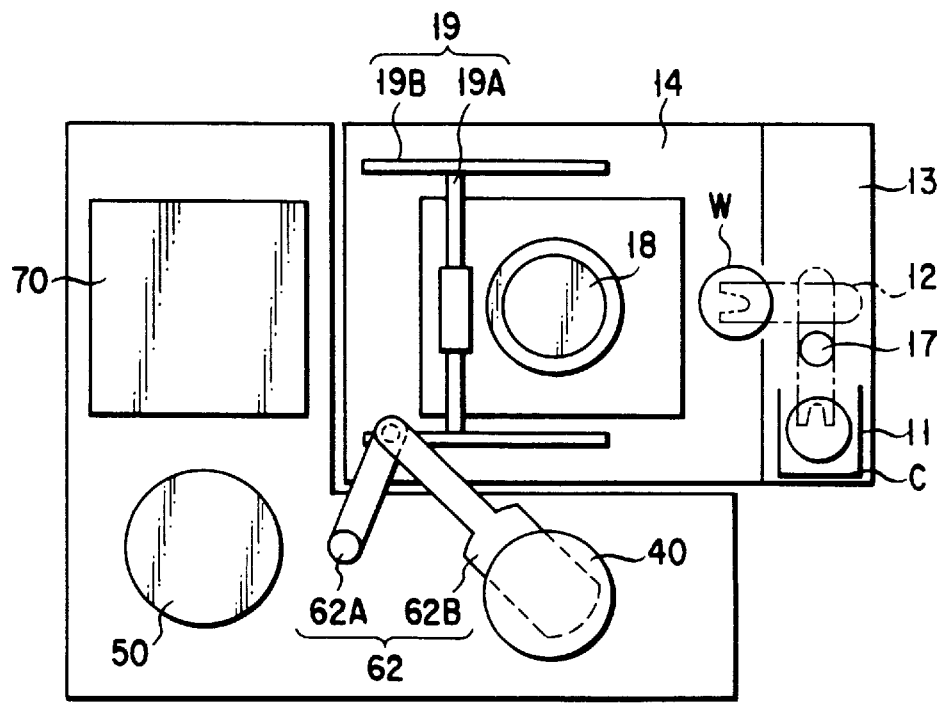
F I G. 3

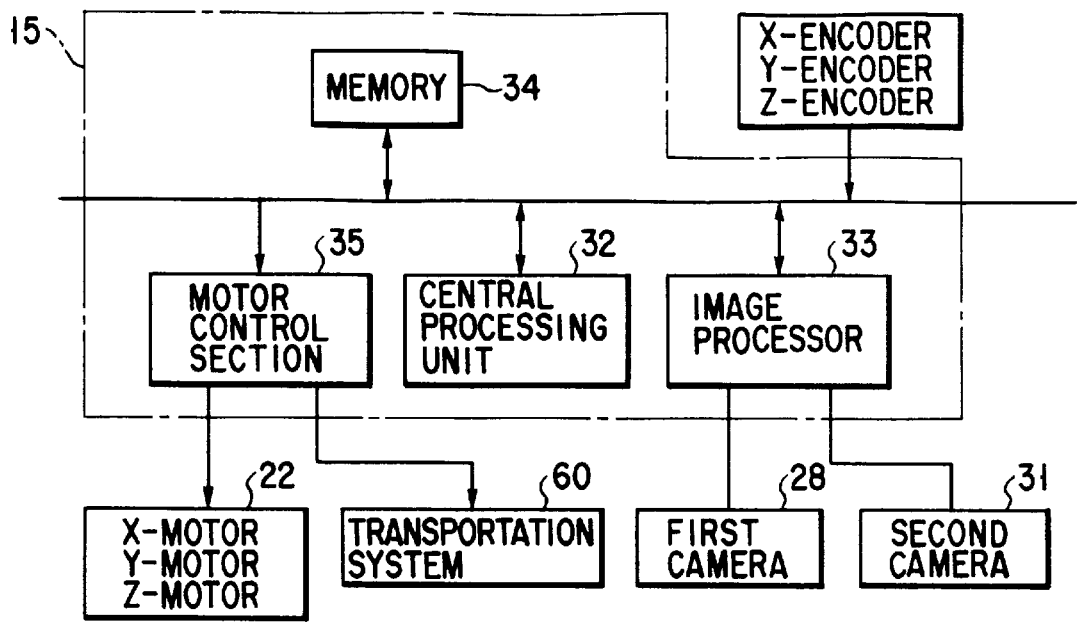
FIG. 6
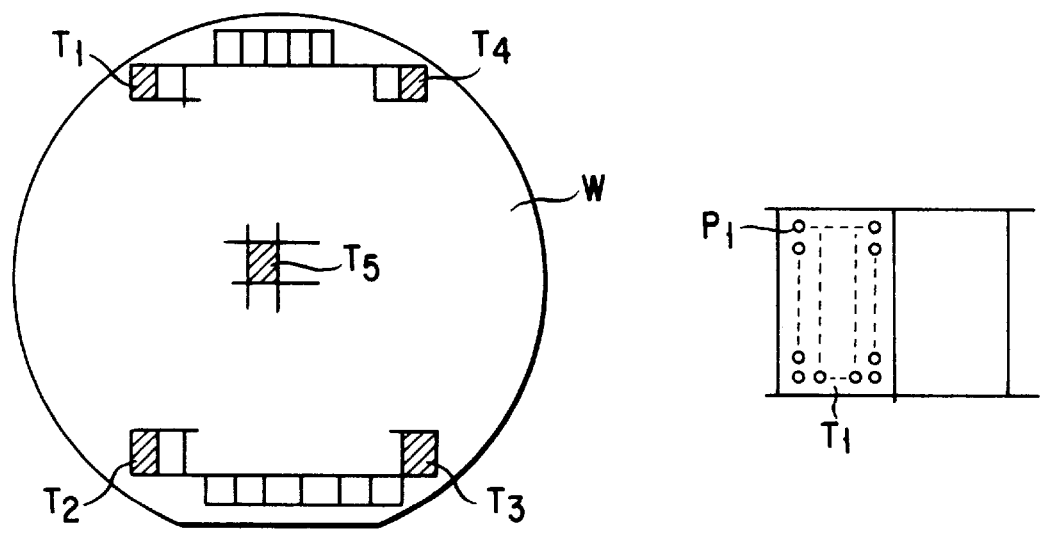
FIG. 7A
FIG. 7B

APPARATUS FOR ALIGNING A SEMICONDUCTOR WAFER WITH AN INSPECTION CONTACTOR

BACKGROUND OF THE INVENTION

The present invention relates to an apparatus for aligning a semiconductor wafer with an inspection contactor, and more particularly, to an apparatus for achieving alignment between a semiconductor wafer and an inspection contactor, whereby a plurality of contacts formed on the contactor and their corresponding electrode pads of each of a plurality of chips formed on the wafer are aligned when they are connected electrically to one another by being brought collectively into touch with one another.

Manufacturing processes for semiconductor wafers include an inspection process in which a large number of IC chips that are formed on the surface of each semiconductor wafer (hereinafter referred to simply as "wafer") are subjected to various electrical inspections without changing the wafer conditions. In this inspection process, nondefective wafers that carry no defective chips thereon are sorted out. (defective ones with defective IC chips thereon.) Only the non-defective wafers are subjected to the next process, such as a semiconductor device assembling process, whereupon individual semiconductor devices are completed as products. Thus, the yield of the products is improved. In a typical example of the inspection process, the individual IC chips are inspected by successively bringing the electrode pads of each IC chip into touch with probes of a probe card. In another example, all the IC chips of each wafer are simultaneously inspected in one lot by bringing all the electrode pads corresponding to the IC chips and a plurality of contacts of an inspection contactor (hereinafter referred to simply as "contactor") corresponding to the pads into touch with one another at a time.

According to the latter process in which the IC chips of each wafer are inspected collectively, the contactor and the wafer are opposed to each other, and a plurality of bumps, as references for the contactor, and their corresponding electrode pads, as references for the wafer, are successively aligned with one another in a manner such that their respective positions are visually observed to be ascertained. The bumps and the electrode pads are brought collectively into touch with one another after they are aligned with success. After this is done, the electrical inspections are conducted by using specific inspection devices, and the chips of the wafers are checked for conformity. Based on the result of this check, non-defective wafers are distinguished from defective ones.

Conventionally, the bumps of a contactor and the electrode pads of a wafer are aligned under visual observation, as described above. Accordingly, aligning the bumps and their corresponding electrode pads is not an efficient operation, costing an operator prolonged labor and increasing the operator's burden. Since the accuracy of alignment varies depending on individual operators, moreover, it is difficult to obtain a steady state of constant.

BRIEF SUMMARY OF THE INVENTION

The object of the present invention is to provide an apparatus for aligning a wafer with a contactor, capable of quickly aligning all contacts used for the inspection of an inspection contactor and their corresponding electrode pads of a wafer with high accuracy.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a front view showing the interior of the alignment apparatus of FIG. 1;

FIG. 3 is a plan view showing the interior of the alignment apparatus of FIG. 1;

FIGS. 5A and 5B are enlarged views of a wafer bearer shown in FIGS. 1 to 4, in which FIG. 5A is a perspective view, and FIG. 5B is an enlarged sectional view corresponding to a part of FIG. 5A;

FIG. 6 is a block diagram showing a control system of the alignment apparatus of FIG. 1;

FIGS. 7A and 7B are views showing a wafer, in which FIG. 7A is a schematic layout mainly showing chips for alignment, and FIG. 7B is an enlarged plan view of one of the chips shown in FIG. 7A.

DETAILED DESCRIPTION OF THE INVENTION

An embodiment of the present invention will now be described in detail with reference to the accompanying drawings of FIGS. 1 to 8C.

Figure 1:
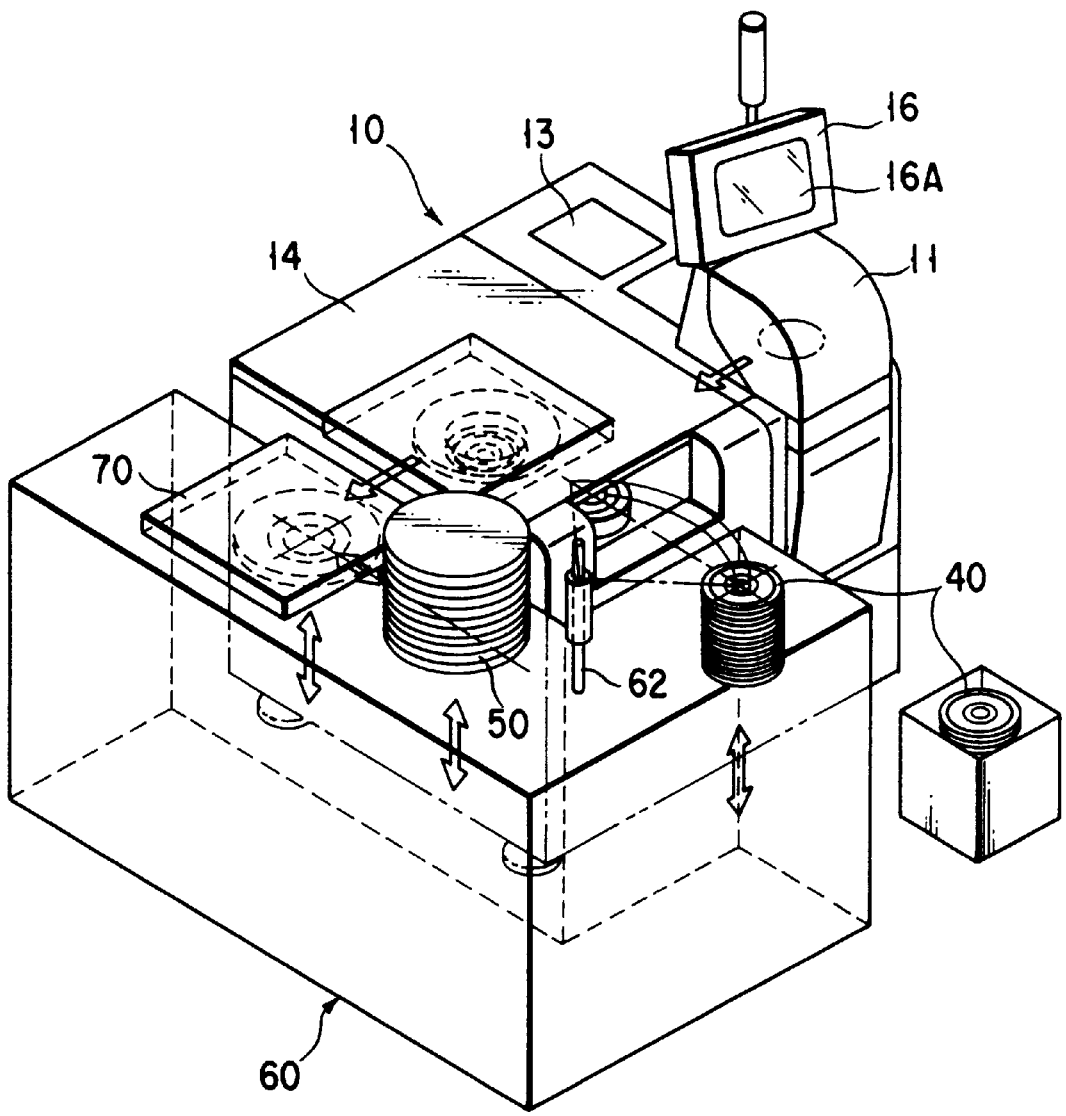
FIG. 1 a perspective view schematically showing an outline of an embodiment of an alignment apparatus according to the present invention.

As shown in FIG. 1, a wafer-contactor alignment apparatus (hereinafter referred to simply as "alignment apparatus") according to the present embodiment comprises an alignment apparatus body (hereinafter referred to simply as "apparatus body") 10 for aligning wafers W and a transportation system 60 located adjacent to the apparatus body 10. The transportation system 60 serves to carry wafer bearers 40 and contactors 50 into the apparatus body 10 and raise and lower transportation vessels (hereinafter referred to as "transportation cassettes" or simply as "cassettes") 70.

As shown in FIGS. 1 to 3, the apparatus body 10 comprises a cassette bearing section 11, a loader section 13, an alignment section 14, a controller 15, and a display device 16. The cassette bearing section 11 carries thereon one or two cassettes C (two cassettes as illustrated) each containing a plurality of wafers W that are held horizontally each and arranged vertically at narrow intervals. The loader section 13 includes a fork or forks 12 for transporting the wafers W in the cassette C. The alignment section 14 aligns the wafer W transported by means of the fork 12 of the loader section 13. The controller 15 controls the alignment section 14, loader section 13, and transportation system 60 in accordance with specific programs. The display device 16 doubles as a control panel for operating the controller 15.

The loader section 13 is provided with a sub-chuck 17 for pre-aligning the wafers W with reference to the orientation flat of each wafer. In the loader section 13, the fork 12 takes out and transports each wafer W from the cassette C. After the wafer W is pre-aligned on the sub-chuck 17, it is transported to the alignment section 14. The alignment section 14 includes a moving body 18, movable in X-, Y-, Z- and θ-directions and having a level upper surface, and an alignment mechanism 19 for aligning the wafer W that is placed onto the upper surface of the moving body 18 via the wafer bearer 40. The wafer bearer 40 may be fixed to the upper surface of the moving body 18 by vacuum suction or the like, as mentioned later, and supports the wafer W transported by the fork 12, thereon.

Figure 4:
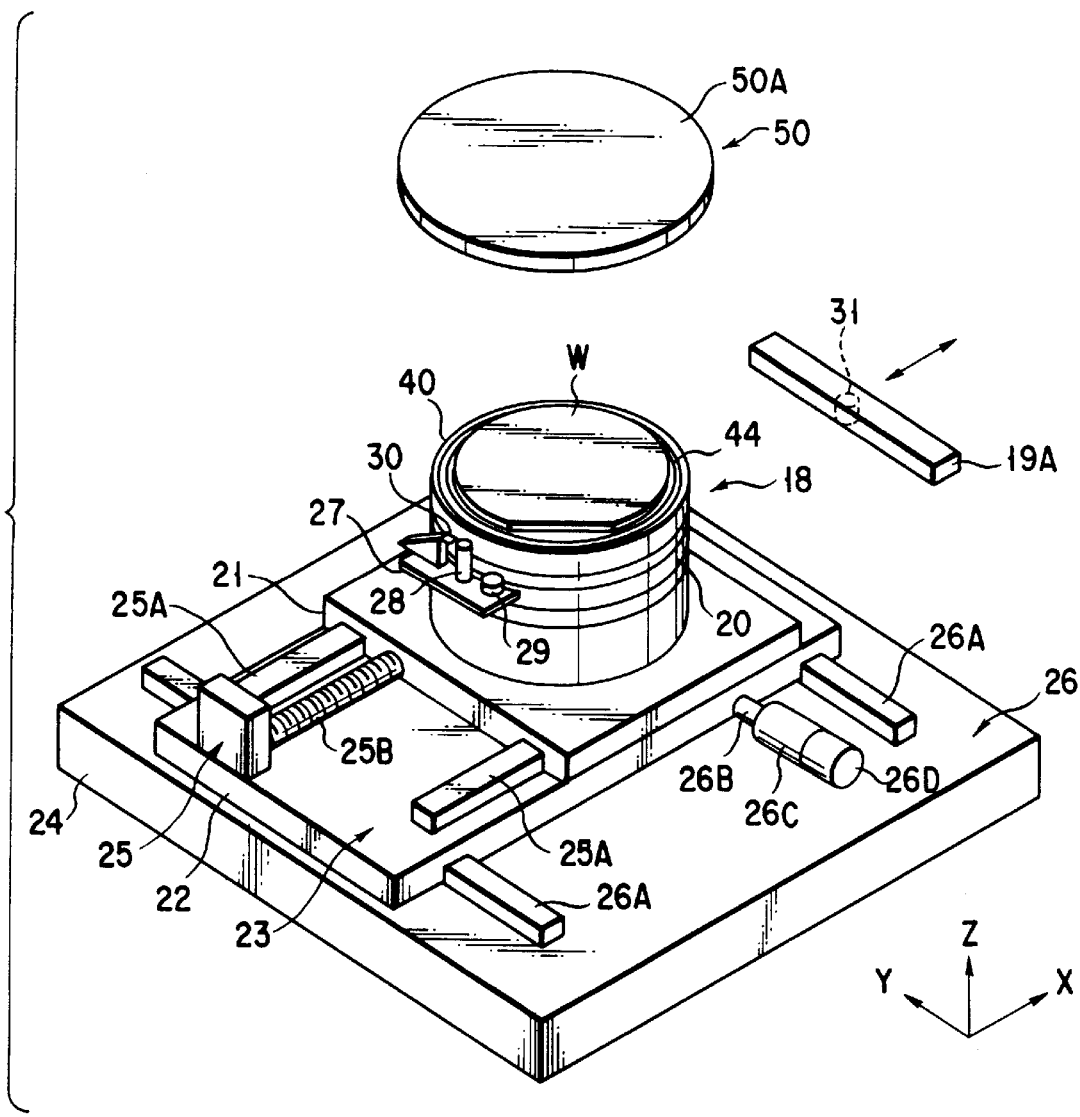
FIG. 4 is a perspective view mainly showing a moving body of the alignment apparatus of FIG. 1 and a drive mechanism therefor.

As shown in FIGS. 2 and 4, the moving body 18 is provided with a main chuck 20, an X-table 21, and a Y-table 22, and is moved in the aforesaid manner on a base 24 by means of a drive mechanism 23. The main chuck 20 can carry the wafer bearer 40 thereon, and is movable in the Z- and θ-directions. The X-table 21 has the main chuck 20 fixed thereon, and is movable in the X-direction. The Y-table 22 has the X-table 21 fixed thereon, and is movable in the Y-direction. As shown in FIG. 4, the drive mechanism 23 comprises an X-direction drive mechanism 25 for driving the X-table 21, a Y-direction drive mechanism 26 for driving the Y-table 22, and a lifting/rotating mechanism (not shown) for driving the main chuck 20 in the Z- and θ-directions. The main chuck 20 is formed having three vertical holes in positions corresponding individually to the vertices of an equilateral triangle that has its center of gravity on the center of the chuck 20. Three delivery pins 20A (one of which is shown in FIG. 5B) are arranged individually in these holes for up-and-down motion. Each of these pins 20A is movable between a down position indicated by full line in FIG. 5B and an up position indicated by two-dot chain line. The pins 20A receive the transported wafer W thereon from the fork 12 in the up position above the upper surface of the wafer bearer 40, and descend to place the wafer on the bearer 40. This up-and-down motion of the delivery pins is achieved by means of a drive mechanism, e.g., a plunger mechanism, in the main chuck 20.

As shown in FIG. 4, the X-direction drive mechanism 25 includes a pair of guide rails 25A, a ball screw 25B, and an X-motor (not shown) for rotating the screw 25B. The rails 25A are fixed on the Y-table 22 so as to extend in the X-direction, and are individually in engagement with a pair of grooves on the lower surface of the X-table 21 so that the X-table is slidable on the rails. The screw 25B has one end portion thereof screwed in a screw hole formed in a side face of the X-table 21, and is rotatable so as to move the X-table along the guide rails 25A. The movement of the X-table 21 is detected by an encoder (not shown) that is attached to the X-motor. The Y-direction drive mechanism 26 includes a pair of guide rails 26A arranged in the same manner as those of the X-direction drive mechanism 25, a ball screw 26B, a Y-motor 26C, and an encoder 26D for detecting the movement of the Y-table 22. The main chuck 20 contains therein a Z-direction drive mechanism (not shown) for moving the same in the Z-direction and a rotation mechanism (not shown) for rotating the chuck in the θ-direction.

A fixed plate 27 extends horizontally along a part of the peripheral surface of the main chuck 20. First image pickup means (hereinafter referred to as "first camera") 28, formed of a high-magnification CCD camera, is located on the fixed plate 27. The first camera 28 picks up an enlarged image of the overlying contactor 50, and causes it to be displayed on a display screen 16A of the display device 16. Further, a low-magnification CCD camera 29 is located adjacent to the first camera 28 on the fixed plate 27. The camera 29 picks up an image of a wider region of the contactor 50, and causes it to be displayed on the screen 16A of the display device 16. Located on the fixed plate 27, furthermore, is a target 30, which extends at right angles to the optical axis of the first camera 28 and serves for focusing. The target 30 is movable with respect to the position of the focus of the first camera 28. The target 30 is formed of, for example, a glass plate and a metallic film of 140 μm diameter deposited on its surface. The first camera 28 recognizes the image with use of the metallic film as a reference pattern, and the target 30 serves as a focusing plane.

As shown in FIG. 3, the alignment mechanism 19 is provided in the alignment section 14. The mechanism 19 includes a pair of parallel guide rails 19B, fixed to the apparatus body and extending in the X-direction, and an alignment bridge 19A guided by these guide rails and movable in the X-direction (direction indicated by the arrow in FIGS. 2 and 4) in a space between the moving body 18 and the contactor 50. The bridge 19A is provided with second image pickup means (hereinafter referred to as "second camera") 31, formed of a CCD camera that can be switched between high- and low-magnification modes. The second camera 31 picks up a low- or high-magnification image of the wafer W on the wafer bearer 40, and causes it to be displayed on the display screen 16A of the display device 16. The focusing plane of the second camera 31, like that of the first camera 28, can be obtained by recognizing the image of the metallic film of the target 30. The alignment mechanism 19 includes the first camera 28, target 30, etc., besides the alignment bridge 19A and the second camera 31.

As shown in FIGS. 1 to 3, the transportation system 60 is an apparatus for independently transporting the cassettes 70, contactors 50, and wafer bearers 40, and comprises a first lift mechanism 61 for raising and lowering a plurality of cassettes 70 together, a second lift mechanism (not shown) for raising and lowering a plurality of contactors 50, and a third lift mechanism (not shown) for raising and lowering a plurality of wafer bearers 40. The raising and lowering directions of these mechanisms are indicated by the arrows in FIG. 1. The transportation system 60 comprises a bearer/contactor transfer mechanism 62 for transferring the wafer bearers 40 from the third lift mechanism onto the main chuck 20 of the moving body 18 and transferring the contactors 50 from the second lift mechanism to a contactor support mechanism (mechanism for placing each contactor on a circular aperture in the center of a head plate), which is located in the apparatus body so as to support each contactor over the main chuck. Although the contactor transfer mechanism and the bearer transfer mechanism are integrated into the common mechanism 62 according to the present preferred embodiment, they may alternatively be independent mechanisms.

As shown in FIG. 2, the first lift mechanism 61 is constructed like a conventional one, and comprises a support base 61A for carrying and supporting the transportation cassettes 70 stacked in layers thereon, a ball screw 61B for raising and lowering the base 61A, and a motor 61D for rotating the screw 61B through the medium of a gear train 61C. As the screw 61B is rotated by the motor 61D, it causes the cassettes 70 on the support base 61A to ascend or descend. The second and third lift mechanisms (not shown) are constructed substantially in the same manner as the first lift mechanism 61.

As shown in FIG. 3, the transfer mechanism 62 includes a multi-joint arm 62B, which is supported on the body of the transportation system by means of a support post 62A so as to be turnable within a horizontal plane. The arm 62B alternatively transfers the uppermost one of the contactors 50 on the second lift mechanism and the uppermost one of the wafer bearers 40 on the third lift mechanism in succession to the main chuck 20 in the apparatus body 10. The support post 62A extends and contracts in the Z-direction, thereby causing the multi-joint arm 62B to move in the Z-direction. Since this horizontally turnable, vertically movable mechanism for taking out articles from a given region, transporting them, and then placing them on another given region is generally known as, for example, a wafer transportation mechanism in the field, a detailed description of its arrangement is omitted. In FIG. 1, the wafer bearers 40, transportation cassettes 70, and contactors 50 are all illustrated in layers. Actually, however, they are held horizontally each and arranged vertically with regular gaps between them in exclusive vessels.

According to the preferred embodiment, the transfer mechanism 62 of the transportation system 60 doubles as an aggregate transportation mechanism (not shown) for transporting each aggregate or unit (not shown) combining the wafer bearer 40 and the contactor 50 from the moving body 18 to a desired one of the transportation cassettes 70 supported by the first lift mechanism 61. Alternatively, however, the aggregate transportation mechanism may be constructed independently. The wafer bearer transfer mechanism for transporting the wafer bearers 40 from their corresponding lift mechanism onto the moving body 18, the contactor transfer mechanism for transporting the contactors 50 from their corresponding lift mechanism onto the moving body 18, and the mechanism for transporting the bearer-contactor aggregates from the moving body 18 into the cassettes 70 may be integrated into the common transfer mechanism 62, as in the case of this preferred embodiment, or constructed separately. Alternatively, any two of the three mechanisms may be integrated into a common mechanism. The way of arranging these mechanisms is selected depending on whether greater importance is attached to the inspection speed or to the compactness of the resulting structure.

Figure 5A:
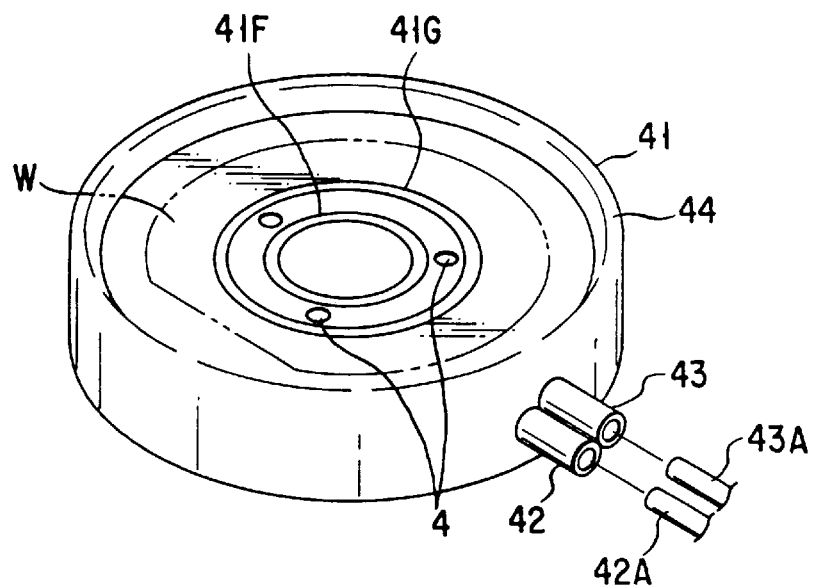
Figure 5B:
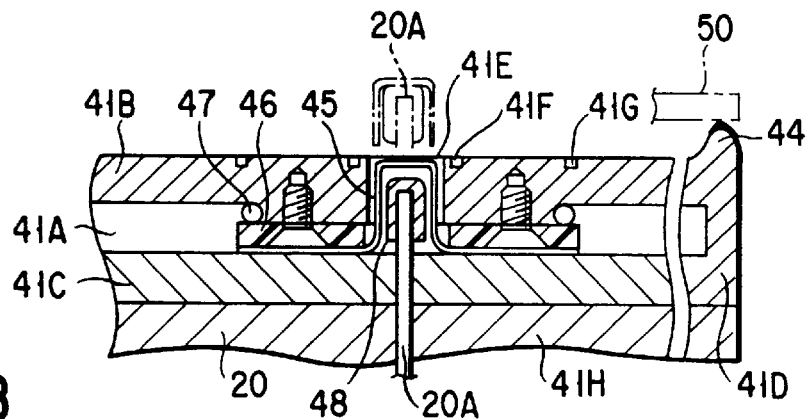

As shown in FIGS. 5A and 5B, each wafer bearer 40 has a hollow disk-shaped body 41 that is composed of disk-shaped top and bottom walls 41B and 41C, which extend parallel to each other, and a peripheral wall 41D. The walls 41B and 41C are spaced vertically so as to define an annular space 41A between them, which forms a first gastight chamber. The body 41 is formed of a metal such as aluminum. The peripheral wall 41D has an annular projection 44 which vertically extends from the top wall 41B. The upper edge of the projection 44 is rounded to linearly contact with the under surface of the contactor 50.

Figure 5C:
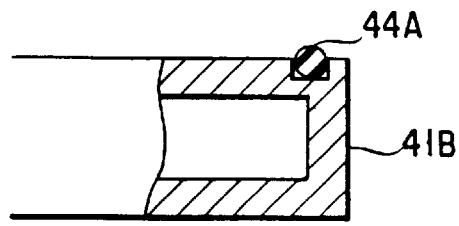
FIG. 5C is across-sectional view of a part of a modified bears.

Instead of the annular projection 44, an O-ring 44A may be used, which is received in an annular groove formed in the top wall 41B to project from the upper surface of the top wall, as shown in FIG. 5C.

The peripheral side of the wall 41D of the body 41 is provided with first and second gas ports 42 and 43, which project therefrom. The first gas port 42 opens into the first gastight chamber 41A, and the second gas port 43 into a second gastight chamber (gastight space) 41E. The chamber 41E is defined between the wafer bearer 40 and its corresponding contactor 50 when a wafer W is supported on a bearing region of the upper surface of the top wall 41B and the contactor 50 is integrated with the bearer 40 into a unit by being abutted on the circular projection on 44 or the O-ring 44A (FIG. 5C). The gas ports 42 and 43 are provided individually with valves that are opened or closed as gas supply pipes 42A and 43A are inserted into or removed from the gas ports. More specifically, when the pipes 42A and 43A are inserted into the gas ports 42 and 43, respectively, the valves connect these pipes and their corresponding gastight chambers. When the supply pipes are removed from the ports, the valves close the gastight chambers against the atmosphere. The gas supply pipes 42A and 43A are arranged on the apparatus body 10 so that they can be moved by a drive mechanism (not shown) between an inserted position in which they are inserted individually in the ports and a standby position in which they are removed from the ports, as described above. The pipes 42A and 43A are connected alternatively to a source of a chemically inert gas, such as nitrogen gas, and an exhaust device. Although these pipes are referred to as "gas supply pipes" for simplicity of expression herein, it is to be understood that they can serve also as exhaust pipes for exhausting the gastight chambers.

The bearing region of the upper surface of the top wall 41B of the hollow body 41, which is surrounded by the annular projection 44 is a high-precision flat surface. The bearing region on which the wafer W is to be placed is formed having two concentric annular grooves 41F and 41G that are smaller in outer diameter than the wafer. The bottom surface of each of these annular grooves 41F and 41G is formed with a plurality of through holes (not shown) that are arranged at predetermined intervals and open into the first gastight chamber 41A. When the wafer W is placed on the bearing region of the top wall 41B so as to cover the ring grooves 41F and 41G, the first gastight chamber 41A is exhausted through the first gas port 42 and the first gas supply pipe 42A that is connected to the exhaust device. By doing this, the annular grooves 41F and 41G can be evacuated through the holes of the annular grooves 41F and 41G so that the wafer W is attracted to the upper surface of the top wall 41B by vacuum suction. Thus, the wafer is fixed to the bearer 40 lest the two be shifted with respect to each other. The vacuum suction means for the wafer to be attracted to the bearer 40 is not limited to the annular groove or grooves, and may, for example, be a plurality of small holes in the bearing region that open into the gastight chambers 41A.

It is advisable to connect the first gas supply pipe 42A to the gas source so that the gastight chamber 41A is supplied with the inert gas and exhausted, thereby replacing the gas in the chamber 41A with the inert gas, before the wafer is attracted to the bearer.

The contactor 50 is placed on the annular projection 44 so that the second gastight chamber (gastight space) 41E is defined between the contactor 50 and the upper wall 41B, with the outer peripheral portion of the lower surface of the contactor 50 in touch with the projection 44 on the body 41 throughout the circumference. In this state, the second gastight chamber 41E is exhausted through the second gas port 43 and the second gas supply pipe 43A that is connected to the exhaust device. By doing this, the contactor 50 is pressed toward the body 41 so that the contactor 50 and the annular projection ring 44 are brought more intimately into touch with each other. Thus, the contactor 50 is attracted to the body 41 by vacuum suction, and is fixed to the bearer lest the contactor and the bearer be shifted with respect to each other.

It is advisable to connect the second gas supply pipe 43A to the gas source so that the gastight chamber 41E is supplied with the inert gas and exhausted, thereby replacing the gas in the chamber 41E with the inert gas, before the aforesaid sucking operation. The respective exhaust degrees of the first and second gastight chambers 41A and 41E are set so that the first chamber 41A is decompressed to a higher extent. In this manner, the wafer W is fixedly supported on the top wall 41B of the bearer 40 by vacuum suction, and the contactor 50 above the wafer is fixedly supported on the annular projection 44 of the bearer by suction. When the gas supply pipes 42A and 43A are disengaged from the bearer 40 thereafter, the reduced pressure in the gastight chambers is maintained, and the wafer W, bearer 40, and contactor 50 are unitized into an aggregate that involves no shifting.

Between the two annular grooves 41F and 41G, the body 41 is penetrated by through holes 4 through which the three delivery pins 20A protruding from the main chuck 20 can be passed individually. That portion of each hole 4 which is formed in the bottom wall 41C has a diameter a little larger than the outer diameter of each pin 20A, and that portion of the hole 4 which is formed in the top wall 41B has a diameter much larger than the outer diameter of the pin 20A. The central portion of an elastic film 45, such as a silicone rubber film, projects and is inserted in the large-diameter portion of the through hole 4. The whole outer peripheral portion of the film 45 is screwed to the upper surface of the bottom wall 41C with the aid of a gasket 46 in the form of a ring-shaped elastic body. The upper surface of the gasket 46 is in touch with the lower surface of the top wall 41B, and an O-ring 47 is interposed between these surfaces. Thus, the first gastight chamber 41A is isolated gastight from the large-diameter portion of the through hole 41H by the elastic film 45, gasket 46, and O-ring 47. The central portion of the film 45, which projects into the large-diameter portion of the hole 4, is cylindrical in shape, and this cylindrical portion preferably contains a cap 48, into which the distal end portion of the pin 20A is fitted from the bottom. In order to receive the wafer W from the fork 12, each pin 20A projects upward from the top wall 41B, as indicated by imaginary line in FIG. 5B. As this is done, the cap 48 covers the top portion of the pin 20A and projects together with the pin above the top wall 41B. Thus, the distal end edge of the pin 20A can be prevented from directly touching and damaging the elastic film 45.

The contactor 50 is composed of a disk-shaped substrate 50A formed of a material (e.g., quartz glass) that is substantially equal to the wafer W in the coefficient of thermal expansion, a plurality of layers of wires formed on the surface of the substrate, and a group of contacts including bumps 50B that protrude substantially at right angles or with some inclination from the substrate surface and are connected to the wires. The outer diameter of the substrate 50A is larger, preferably a little larger, than that of the annular projection 44 and the O-ring 44A. Further, a ring-shaped surface region of the substrate 50A that is touched by the annular projection 44 is a flat surface without any wires or the like thereon. The bumps and contacts are formed of, for example, gold or a gilt material with high electrical conductivity, while the wires are formed of a high-conductivity material such as aluminum.

As shown in FIG. 6, the controller 15 includes a central processing unit 32, an image processor 33, a memory 34, and a motor control section 35, and serves to control the operation of the apparatus body 10 and the first, second, and third drive mechanisms of the transportation system 60. The central processing unit 32, for example, transmits control signals to the motor control section 35 in accordance with programs registered in the memory 34, thereby controlling the individual motors of the drive mechanism 23. Further, the processing unit 32 receives pulse signals from the encoders, calculates movements in the X-, Y-, Z- and θ-directions, calculates position data on the moving body 18, or registers the memory 34 with data such as the results of calculation. The image processor 33 receives pickup image signals from the first and second cameras 28 and 31 and the like, subjects the signals to image processing, and causes the processed images to be displayed as pickup images on the display screen 16A or registered as image data in an image memory. Further, the processor 33 compares the pickup images with image data previously registered in the image memory, or determines whether the pickup images from the first and second cameras 28 and 31 are focused or not.

Referring now to FIGS. 7A, 7B, 8A, 8B and 8C, a method for collectively aligning the contactors 50 and the wafers W by means of the alignment apparatus of the present embodiment will be described. According to this alignment method using the alignment apparatus, specific electrode pads P of five IC chips T1 to T5, out of a large number of IC chips of the wafer W, and the bumps 50B of the contactor 50 corresponding thereto are aligned in succession in the alignment section 14 under the control of the controller, as shown in FIGS. 7A and 7B. Thereafter, all the contacts of the contactor 50 and all the pads of the wafer W are brought collectively into touch with one another. The following is a specific description of the alignment method.

First, the wafer bearer 40 and the contactor 50 are arranged in predetermined positions in the alignment section 14 of the apparatus body 10, that is, on the circular aperture in the center of the head plate and on the moving body 18, respectively, by means of the transportation system 60 that operates in accordance with given programs under the control of the controller 15. More specifically, when the second and third lift mechanisms are actuated so that the uppermost contactor 50 and the uppermost wafer bearer 40 are brought to the height of the multi-joint arm 62B of the transfer mechanism 62, the mechanism 62 is actuated so that its arm 62B receives the uppermost bearer 40, and transports it onto the moving body 18. Then, the arm 62B receives the uppermost contactor 50 and transports it to a position under the aperture of the head plate. The transported wafer bearer 40 is fixed on the moving body 18 by vacuum suction, while the transported contactor 50 is supported on the aperture by means of the support mechanism that are attached to the head plate. Subsequently or in synchronism with this, the wafer W is transported from the cassette bearing section 11 to the alignment section 14 in the loader section 13 of the apparatus body 10, which operates in accordance with the given programs under the control of the controller 15. More specifically, the fork 12 is actuated in the loader section 13, and is inserted into the cassette C in the bearing section 11, as shown in FIG. 3. Then, the fork 12 holds the wafer W thereon by vacuum suction, and carries it out from the cassette C. Thereafter, the wafer W is transferred to the sub-chuck 17 to be pre-aligned thereby. After the pre-alignment, the wafer W is received again from the sub-chuck 17 by the fork 12 and delivered to the alignment section 14. Then, the fork 12, already held on standby in the alignment section 14, takes out and transports the wafer W from the cassette, and places it on the three delivery pins 20A that project through the wafer bearer 40 on the moving body 18. As these pins are lowered, the wafer is put on the center of the top wall of the bearer 40. Subsequently or during this operation, the gas supply pipes 42A and 43A are inserted into their corresponding gas ports 42 and 43. Then, the first gastight chamber 41A is evacuated through the pipe 42A. As a result, the annular grooves 41F and 41G are also evacuated, whereupon the wafer is attracted to the upper surface of the top wall 41B by vacuum suction.

Figure 8A:
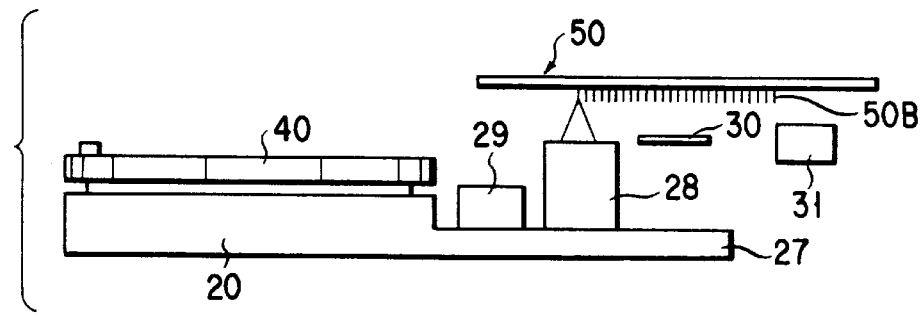
FIGS. 8A, 8B and 8C are respectively views for illustrating different steps of alignment operation for a wafer and bumps of a contactor.

Before the wafer W is delivered onto the bearer 40, the low-magnification CCD camera 29 is moved to a position under the contactor 50 as the moving body 18 is moved by the drive mechanism 23, in the alignment section 14. Further, the first camera 28 is raised up to the position corresponding to its focus, whereupon the CCD camera 29 recognizes the bumps 50B. Thereafter, the first camera 28 is moved to the position under the contactor 50, as shown in FIG. 8A, whereupon it recognizes and picks up an image of the bump 50B that corresponds to an electrode pad P1 at a corner portion of the IC chip T1 (see FIGS. 8A and 8B) previously registered in a memory 34 of the contactor 50. The resulting image is aligned with a mark (+) in the center of the display screen 16A. Thereupon, the position of the bump 50B is calculated in the central processing unit 32 in accordance with pulse signals from the encoders based on the movement of the moving body 18 at that time, and is obtained in the form of positional coordinates (X1, Y1, Z1). These processed coordinates (X1, Y1, Z1) are registered in the memory 34 through the processing unit 32. Then, the first camera 28 is gradually moved counterclockwise to positions right under four bumps 50B that correspond individually to the four other IC chips T2 to T5, whereupon positional coordinates (X2, Y2, Z2), (X3, Y3, Z3), (X4, Y4, Z4), and (X5, Y5, Z5) for the individual bumps 50B are successively obtained in the same manner as aforesaid. These positional coordinates are registered in the memory 34 through the central processing unit 32.

Figure 8B:
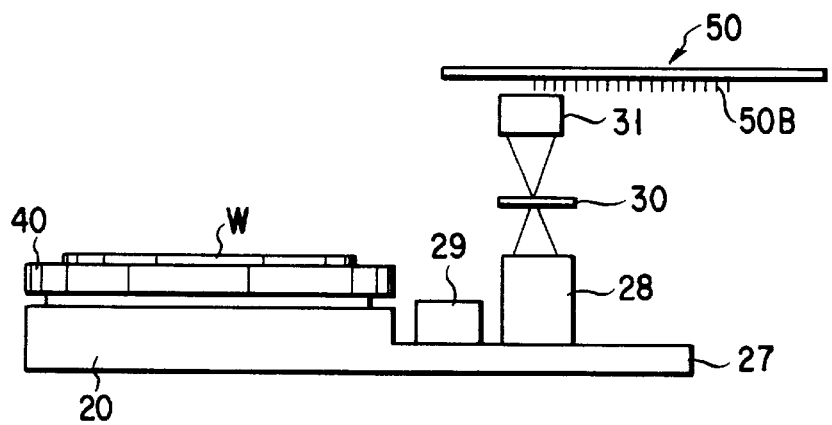
Figure 8C:
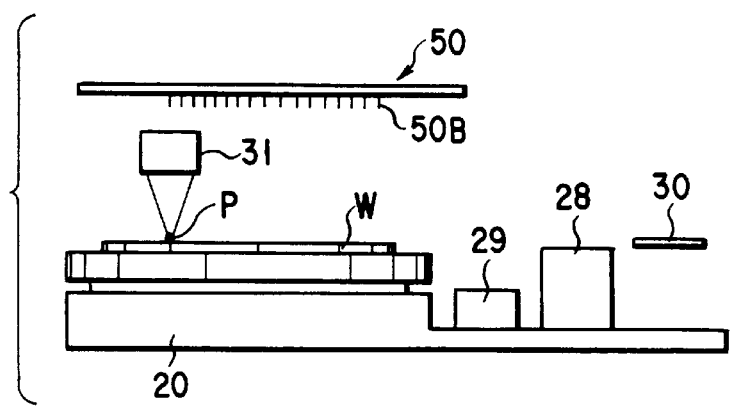

Then, the respective optical axes of the first and second cameras 28 and 31 are aligned in the manner shown in FIG. 8B, and the respective reference positions of the cameras are obtained. More specifically, after the wafer W is delivered from the loader section 13 and placed on the wafer bearer 40 on the moving body 18 in the alignment section 14 by the fork 12, the alignment bridge 19A moves horizontally in the region between the moving body 18 and the contactor 50, and is stopped at a fixed position below the contactor 50. The target 30 is advanced over the first camera 28, whereupon the camera 28 is focused on the center of the target 30 and recognizes the metallic film thereon, and the second camera 31 is also focused on the center of the target 30 and recognizes the metallic film. Thus, the respective optical axes of the first and second cameras 28 and 31 are aligned with each other. Reference coordinates (X0, Y0, Z0) for the point of intersection between the focusing plane and the optical axes in this state are calculated on the basis of the position of the moving body 18. The calculated values are registered in the memory 34. The movement of the first camera 28 at this time is detected by means of the encoders, so that the positional relationships between the positional coordinates and the reference coordinates for the bumps 50B can be obtained on a coordinate system.

Thereafter, the center and diameter of the wafer W are obtained by means of the second camera 31. After the target 30 is retreated from the focusing plane of the first camera 28, the moving body 18 is moved by the drive mechanism 23. As this is done, three points, for example, on the peripheral portion of the wafer W are detected by means of the second camera 31. Based on the result of this detection, the center and diameter of the wafer W are calculated by the central processing unit 32 in accordance with the moved distance of the moving body 18, and the calculated values are registered in the memory 34. Subsequently, a scribe line of the wafer W is surveyed at a low magnification by means of the second camera 31, and the X- and Y-axes of the wafer W are rotated in the θ-direction to be aligned with the X- and Y-axes of the X- and Y-tables 20 and 22, respectively. Thus, the IC chips T of the wafer W can be arranged in line with the direction of index feed.

When the moving body 18 is moved by the drive mechanism 23, moreover, an image of the wafer W on the moving body 18 is recognized by the second camera 31 in the low-magnification mode. In the image processor 33, the pickup image is compared with previously registered chip images that are unique images for alignment, and a corresponding chip image is looked up. If the corresponding chip image is retrieved, the chip image magnified in the high-magnification mode is compared with previously registered unique chip images (see FIGS. 7A and 7B), and a corresponding chip image is retrieved. The retrieved image is registered as an image of the bumps 50B for alignment in the image processor 33. If the corresponding chip image is retrieved, the camera is moved to the center, upper side, lower side, left-hand side, and right-hand side of the wafer W at a stroke equal to an integral multiple of the chip size that is previously known from the retrieved image. During this movement, images of the wafer W are compared with the previously registered unique chip images as they are picked up by means of the second camera 31, and corresponding chip images are successively fetched and registered in the image processor 33. The respective moved distances of the IC chips T1 to T5 in the X- and Y-directions of the wafer W and θ are calculated in the central processing unit 32, and are registered in the memory 34.

After positional coordinates for five bumps 50B of the contactor 50 and positional coordinates for five electrode pads P are obtained in the aforesaid manner, the wafer W is moved in the horizontal direction so that the respective positional coordinates (X, Y) of the five bumps 50B in the X- and Y-directions and the respective positional coordinates (X, Y) of the five pads P in the X- and Y-directions are coincident. More specifically, the horizontal distances between the five bumps 50B and the five IC chips T are calculated by the central processing unit 32 in accordance with their respective positional coordinates (X, Y), and control signals based on these calculated values are transmitted from the processing unit 32 to the motor control section 35. Thereupon, the drive mechanism 23 is actuated to move the moving body 18 in the horizontal direction under the control of the control section 35. The mechanism 23 is stopped when the respective positional coordinates of the five IC chips T and the contactor 50 are aligned vertically. Further, the height at which the five bumps 50B and the five electrode pads P are in touch with one another is calculated by means of the central processing unit 32 in accordance with the respective Z-direction coordinate values of the contactor 50 and the IC chips T. Control signals based on these calculated values are transmitted from the processing unit 32 to the motor control section 35, whereupon the drive mechanism 23 is actuated to move the moving body 18 upward under the control of the control section 35. Thus, the respective electrode pads P of the five IC chips T are brought individually into touch with their corresponding bumps 50B. When the pads P and the bumps 50B are securely in electrical contact with one another, all the contacts of the contactor 50 and the bumps 50B are brought collectively into touch with their corresponding electrode pads P of the wafer W, and the wafer W is sealed in the second gastight chamber 41E between the wafer bearer 40 and the contactor 50 by the annular projection 44.

When the wafer W and the contactor 50 (more exactly, all the electrode pads and all the contacts and bumps) are in touch with each other, nitrogen gas is supplied to the second gastight chamber 41E through the second gas supply pipe 43A and the second gas port 43. Then, the gas in the chamber 41E is discharged through the port 43 and the 43A. As a result, the nitrogen gas pressure in the space (second gastight chamber) between the wafer bearer 40 and the contactor 50 is reduced, whereupon the contactor 50 is attracted to the annular projection 44 by vacuum suction and fixed on the bearer 40. If the supply pipes 42A and 43A are removed from their corresponding ports 42 and 43 in this state, the valves attached to the ports 42 and 43 are closed. Accordingly, the first and second gastight chambers 41A and 41E are kept in a decompressed atmosphere of an inert gas or nitrogen gas in a manner such that the degree of vacuum of the first gastight chamber is higher than that of the second gastight chamber. In consequence, an aggregate or unit is assembled combining the wafer bearer 40 and the contactor 50, which are prevented from relative movement, and the wafer W held between them.

Each completed unit is transported into one of the cassettes 70, which are supported by the first lift mechanism 61, by means of the transfer mechanism 62 or any other transportation mechanism (not shown). Thereupon, a package is constructed including a cassette and a bearer-contactor-wafer unit housed therein.

When a plurality of units are successively loaded into all cassettes placed on the first lift mechanism 61, thereby forming packages in this manner, these packages are transported from the apparatus to any other place or section, whereupon they are inspected or stored for inspection. Preferably, an aperture is formed beforehand in a lock plate of each cassette, that is, in that wall of the cassette which faces the contactor. An inspection member can be connected electrically to the wiring of the contactor through this aperture.

According to the present embodiment, as described above, there may be provided an alignment apparatus, which comprises the first camera 28 for picking up an image of each bump 50sB of the contactor 50 removably mounted on the head plate of the alignment apparatus body 10, the moving body 18 having the first camera 28 fixed thereon and provided with the wafer bearer 40 for supporting the wafer W thereon, the drive mechanism 23 for moving the moving body 18 in the X-, Y-, Z- and θ-directions, the controller 15 for controlling the movements of the moving body 18 moved in the X-, Y-, Z- and θ-directions by the drive mechanism 23, the second camera 31 for picking up an image of each electrode pad P of the wafer W on the moving body 18 moving under the control of the controller 15, and the memory 34 for storing positions for the first and second cameras 28 and 31 to pick up the images. Images of the five bumps 50B distributed in the predetermined positions on the wafer W are picked up one after another by means of the first camera 28, the respective positional coordinates of these bumps 50B are stored in the memory 34. Also, the electrode pads P corresponding to these bumps 50B are picked up by means of the second camera 31, and the respective positional coordinates of the pads P are stored in the memory 34. The bumps 50B and the electrode pads P are aligned in a manner such that the movements of the moving body 18 moved to the position for the alignment are calculated in succession by means of the central processing unit 32 in accordance with data on the corresponding positional coordinates of the bumps 50B and the pads P in the memory 34. By doing this, all the bumps (contacts) 50B of the contactor 50 and their corresponding electrode pads P of the wafer W can be quickly aligned with high accuracy, and besides, can be brought collectively into touch with one another for certain.

The contactor 50, wafer bearer 40, and wafer W are unitized to be prevented from relative movement and housed in the cassette 70 in a manner such that the wafer is protected between the contactor and the bearer and that the contacts of the contactor and the electrode pads of the wafer are electrically in contact with one another. Accordingly, the unit can be kept in the transportation cassette 70 as it is transported to an inspection stage. Preferably, means should be provided for preventing the unit from moving in the cassette 70. This means may be formed of a pair of elastic members that elastically hold the unit, an elastic member that presses the unit against the inner wall of the cassette, or a cassette having an inner width substantially equal to the outer diameter of the unit.

Further, the transportation system 60 for transporting the transportation cassettes 70, contactors 50, and wafer bearers 40 is located adjacent to the alignment apparatus body 10. The system 60 comprises the first lift mechanism 61 for raising and lowering the transportation cassettes 70, the second lift mechanism for raising and lowering the contactors 50, the third lift mechanism for raising and lowering the wafer bearers 40, and the transfer mechanism 62 for transporting each contactor 50 to the predetermined position over the moving body 18 and transferring each wafer bearer 40 onto the main chuck 20 of the moving body 18. Thus, a plurality of wafers W can be automatically aligned one after another.

The embodiment described above is only an example of the present invention. The mechanism for transporting the wafers W, wafer bearers 40, etc. can be suitably designed as required, and the design of the bearer 40 may be changed if necessary.

In an aspect of the present invention, there may be provided a wafer-contactor alignment apparatus capable of quickly aligning all the contacts of the inspection contactor and their corresponding electrode pads of the wafer with high accuracy.

In another aspect of the invention, there may be provided a wafer-contactor alignment apparatus capable of transporting the aligned semiconductor wafer and inspection contactor in one to the inspection stage.

In still another aspect of the invention, there may be provided a wafer-contactor alignment apparatus capable of automatically aligning a plurality of semiconductor wafers and wafer bearers one after another.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. An apparatus for aligning a plurality of contacts formed on an inspection contactor and a plurality of electrodes of all chips formed on a semiconductor wafer and bringing the contacts and the electrodes collectively into touch with one another, the alignment apparatus comprising:

an apparatus body;

a first image pickup for picking up an image of the inspection contactor located in the apparatus body;

a moving body located in the apparatus body so as to be moved in X-, Y-, Z- and θ-directions and having the first image pickup fixed thereon;

a wafer bearer being located on the moving body and supporting the semiconductor wafer;

a driver for moving the moving body having thereon the bearer supporting the semiconductor wafer, in the X-, Y-, Z- and θ-directions; and a controller for controlling movements of the moving body moved in the individual directions by the driver;

A second image pickup for picking up an image of the semiconductor wafer on the bearer moving under the control of the controller;

a memory for storing positions for the first and second image pickups to pick up the images;

an image processor for causing the first image pickup to pick up an image of the contacts, causing the memory to store the position of the contacts, causing the second image pickup to pick up an image of the electrodes corresponding to the contacts, causing the memory to store the position of the electrodes, and causing the controller to align the contacts and the electrodes in accordance with the respective positions of the contacts and the electrodes;

a first transfer mechanism for transporting the inspection contactor to a region over the moving body, and for transporting the wafer bearer onto the moving body; and a second transfer mechanism for transporting the semiconductor wafer onto the bearer on the moving body, wherein said driver moves the moving body in the θ-direction so that the aligned contacts and the electrodes corresponding thereto are brought into touch with each other.

2. An apparatus according to claim 1, which further comprises means for fixing the inspection contactor having the contacts in touch with the electrodes, the semiconductor wafer, and the bearer so as not to be shifted with respect to one another, thereby forming an aggregate including the inspection contactor, the semiconductor wafer, and the bearer.

3. An apparatus according to claim 2, wherein which further comprises a cassette for containing the aggregate and a third transfer mechanism for transporting the aggregate into the cassette.

4. An apparatus according to claim 3, wherein said first and third transfer mechanism are arranged adjacent to the apparatus body, and include a first lift mechanism for raising and lowering a plurality of cassettes, a second lift mechanism for raising and lowering a plurality of inspection contactors, and a third lift mechanism for raising and lowering a plurality of wafer bearers, respectively.

5. An alignment apparatus according to claim 1, wherein said moving body has an upper surface on which the wafer bearer is placed, the moving body including at least three wafer delivery pins extending from the upper surface thereof, and said wafer bearer includes through holes, in which the delivery pins are inserted so as to project from the bearing region.

6. An alignment apparatus comprising:

an alignment apparatus body; and a transportation system, the transportation system supporting a plurality of cassettes for integral movement, a plurality of contactors for integral movement, and a plurality of wafer bearers for integral movement;

the alignment apparatus body including a case bearing section for carrying thereon cases each containing a plurality of semiconductor wafers, an alignment section in which one of the contactors and one of the wafer bearers are opposed to each other so that the contactor and the semiconductor wafer placed on the wafer bearer are aligned and integrated together with the wafer bearer into a unit, and a loader section provided with a wafer transportation mechanism for transporting the semiconductor wafer from the case bearing section to the alignment section; and the transportation system including a transportation mechanism for transporting the one contactor and the wafer bearer to the alignment section and transporting the unit from the alignment section into a cassette, and a controller for controlling the transportation system and the alignment apparatus so that the transportation of the wafer bearer, the contactor, and the semiconductor wafer to the alignment section, the alignment between the contactor and the semiconductor wafer, the integration of the contactor, the semiconductor wafer, and the wafer bearer, and the transportation of the unit into the cassette are repeated in succession.

* * * * *